(12) United States Patent
Qi et al.

(10) Patent No.: US 11,422,176 B2
(45) Date of Patent: Aug. 23, 2022

(54) METHOD AND DEVICE FOR MEASURING RADIATION PATTERN OF ANTENNA ARRAY, AND COMPUTER READABLE STORAGE MEDIUM

(71) Applicant: GENERAL TEST SYSTEMS INC., Guangdong (CN)

(72) Inventors: Yihong Qi, Guangdong (CN); Wei Yu, Guangdong (CN); Penghui Shen, Guangdong (CN)

(73) Assignee: GENERAL TEST SYSTEMS INC., Guangdong (CN)

( * ) Notice: Subject to any disclaimer, the term of this patent is extended or adjusted under 35 U.S.C. 154(b) by 86 days.

(21) Appl. No.: 16/197,415

(22) Filed: Nov. 21, 2018

(65) Prior Publication Data

US 2019/0158198 A1    May 23, 2019

(30) Foreign Application Priority Data

Nov. 21, 2017 (CN) .......................... 201711165633.8

(51) Int. Cl.
*G01R 29/10* (2006.01)
*H04B 17/391* (2015.01)
(Continued)

(52) U.S. Cl.
CPC ........... *G01R 29/10* (2013.01); *H04B 17/102* (2015.01); *H04B 17/391* (2015.01); *H04B 17/12* (2015.01); *H04B 17/3912* (2015.01)

(58) Field of Classification Search
CPC ....................... H04B 17/00–3913; G01R 29/10
See application file for complete search history.

(56) References Cited

U.S. PATENT DOCUMENTS

| 4,121,209 A | * | 10/1978 | ap Rhys | ............... G01S 13/5242 342/368 |
| 4,660,050 A | * | 4/1987 | Phillips | ................... F16F 15/08 343/753 |

(Continued)

FOREIGN PATENT DOCUMENTS

JP         2010025787 A    *  2/2010

OTHER PUBLICATIONS

Antenna boresight—Wikipedia, retrieved from https://en.wikipedia.org/wiki/Antenna_boresight (Year: 2020).*

(Continued)

*Primary Examiner* — Gennadiy Tsvey
(74) *Attorney, Agent, or Firm* — Hodgson Russ LLP

(57) ABSTRACT

The present disclosure provides a method and a device for measuring a radiation pattern of an antenna array. The method includes: obtaining a plurality of array radiation patterns corresponding to a plurality of array elements and a plurality of center positions corresponding to the plurality of array radiation patterns; feeding a preset port excitation to the antenna array; obtaining a plurality of sets of measurement data of the antenna array at a plurality of corresponding measurement points in a far field of the antenna array; obtaining an aperture field excitation based on the plurality of array radiation patterns, the plurality of center positions, positions of the plurality of measurement points and the plurality of sets of measurement data; and obtaining a radiation pattern of the antenna array at a target position based on the aperture field excitation, the plurality of array radiation patterns and the plurality of center positions.

18 Claims, 2 Drawing Sheets

(51) Int. Cl.
*H04B 17/12* (2015.01)
*H04B 17/10* (2015.01)

(56) References Cited

U.S. PATENT DOCUMENTS

| | | | | |
|---|---|---|---|---|
| 4,675,680 | A * | 6/1987 | Mori | H01Q 1/1257 342/352 |
| 5,204,685 | A * | 4/1993 | Franchi | G01R 29/10 342/360 |
| 5,283,585 | A * | 2/1994 | Kneale | G01S 7/4052 342/169 |
| 5,719,794 | A * | 2/1998 | Altshuler | G06F 30/00 703/1 |
| 7,877,113 | B2 * | 1/2011 | Kish | H04B 7/061 455/562.1 |
| 9,041,610 | B1 * | 5/2015 | Henrie | G01R 29/10 343/703 |
| 9,170,317 | B1 * | 10/2015 | Lyon | H01Q 1/1257 |
| 9,660,739 | B2 * | 5/2017 | Reed | H04B 17/12 |
| 9,705,190 | B2 * | 7/2017 | Kyösti | H04B 7/0617 |
| 9,742,508 | B1 * | 8/2017 | Kyosti | H04B 17/3911 |
| 9,912,418 | B2 * | 3/2018 | Foegelle | H04B 17/0085 |
| 10,128,967 | B2 * | 11/2018 | Kyosti | H04W 24/06 |
| 10,277,337 | B2 * | 4/2019 | Bai | H04B 17/309 |
| 10,302,685 | B2 * | 5/2019 | Luo | G01R 29/0821 |
| 10,574,369 | B2 * | 2/2020 | Jing | H04B 17/14 |
| 10,601,695 | B2 * | 3/2020 | Kyosti | H04L 43/12 |
| 2002/0171583 | A1 * | 11/2002 | Purdy | H01Q 3/267 342/368 |
| 2005/0104736 | A1 * | 5/2005 | Gudat | B66C 15/045 340/686.6 |
| 2006/0194553 | A1 * | 8/2006 | Ozaki | H04W 24/00 455/226.1 |
| 2008/0240280 | A1 * | 10/2008 | Li | H04B 7/0608 375/267 |
| 2009/0186658 | A1 * | 7/2009 | Jiang | H01Q 21/061 455/562.1 |
| 2011/0306306 | A1 * | 12/2011 | Reed | H04B 17/391 455/67.11 |
| 2012/0069768 | A1 * | 3/2012 | Ghassemzadeh | H04L 1/0643 370/252 |
| 2014/0300519 | A1 * | 10/2014 | Estebe | G01R 29/10 343/703 |
| 2016/0254870 | A1 * | 9/2016 | O'Keeffe | H04B 17/14 455/67.14 |
| 2018/0006745 | A1 * | 1/2018 | Vanwiggeren | H04B 17/3912 |
| 2018/0048398 | A1 * | 2/2018 | El-Hassan | H01Q 3/36 |
| 2018/0115064 | A1 * | 4/2018 | Safavi-Naeini | H01Q 3/267 |
| 2019/0004139 | A1 * | 1/2019 | Zhang | H01Q 1/521 |

OTHER PUBLICATIONS

IEEE Standard Definitions of Terms for Antennas, IEEE Std 145™-2013, The Institute of Electrical and Electronics Engineers, Inc., Mar. 11, 2014 (Year: 2014).*

* cited by examiner

METHOD AND DEVICE FOR MEASURING RADIATION PATTERN OF ANTENNA ARRAY, AND COMPUTER READABLE STORAGE MEDIUM

FIELD

The present disclosure relates to the field of antenna technology, and more particularly to a method and a device for measuring a radiation pattern of an antenna array, and a non-transitory computer readable storage medium.

BACKGROUND

An antenna array is an antenna system formed by a plurality of identical single antennas (such as symmetrical antennas) arranged in a regular pattern, the antenna array is also called an array antenna. An independent unit of the antenna array is commonly called an array element or an antenna unit. A radiation pattern is an important technical parameter of the antenna array.

SUMMARY

According to embodiments of the present disclosure, there is provided a method for measuring a radiation pattern of an antenna array. The method includes: obtaining a plurality of array radiation patterns corresponding to a plurality of array elements, the antenna array including the plurality of array elements; obtaining a plurality of center positions corresponding to the plurality of array radiation patterns; feeding a preset port excitation to the antenna array, to excite the plurality of array elements; obtaining a plurality of sets of electromagnetic field measurement data of the antenna array at a plurality of corresponding measurement points in a far field of the antenna array, each set of the electromagnetic field measurement data including amplitude and phase; obtaining an aperture field excitation based on the plurality of array radiation patterns, the plurality of center positions, positions of the plurality of measurement points and the plurality of sets of electromagnetic field measurement data; and obtaining a radiation pattern of the antenna array at a target position based on the aperture field excitation, the plurality of array radiation patterns and the plurality of center positions.

According to embodiments of the present disclosure, there is provided a device for measuring a radiation pattern of an antenna array. The device includes an anechoic chamber, a rotary table, a plurality of testing antennas and a controller. The rotary table is disposed in the anechoic chamber, and is configured to set an antenna array. The plurality of testing antennas are disposed in the anechoic chamber.

The controller is configured to: obtain a plurality of array radiation patterns corresponding to a plurality of array elements, the antenna array including the plurality of array elements; obtain a plurality of center positions corresponding to the plurality of array radiation patterns; feed a preset port excitation to the antenna array, to excite the plurality of array elements; obtain a plurality of sets of electromagnetic field measurement data of the antenna array obtained by the plurality of testing antennas, each set of the electromagnetic field measurement data including amplitude and phase; obtain an aperture field excitation based on the plurality of array radiation patterns, the plurality of center positions, positions of the plurality of measurement points and the plurality of sets of electromagnetic field measurement data; and obtain a radiation pattern of the antenna array at a target position based on the aperture field excitation, the plurality of array radiation patterns and the plurality of center positions.

According to embodiments of the present disclosure, there is provided a non-transitory computer readable storage medium having computer programs stored therein. When the computer programs are executed by a processor, the processor is configured to perform the above method.

BRIEF DESCRIPTION OF THE DRAWINGS

These and other aspects and advantages of embodiments of the present disclosure will become apparent and more readily appreciated from the following descriptions made with reference to the drawings, in which.

DETAILED DESCRIPTION

Reference will be made in detail to embodiments of the present disclosure. It should be understood that, the following description is only illustrative and is intended to explain the present disclosure, and cannot be construed to limit the present disclosure.

In addition, terms such as "first" and "second" are used herein for purposes of description and are not intended to indicate or imply relative importance or significance or to imply the number of indicated technical features. Thus, the feature defined with "first" and "second" may include one or more selected from this feature. In the description of the present invention, the phrase of "a plurality of" means two or more than two, unless specified otherwise.

In addition, in the present disclosure, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

The antenna array includes N array elements. The radiation pattern of the antenna array may be considered as the vector superposition of the array radiation pattern of the N array elements under the excitation of the aperture field. In the present disclosure, the aperture field excitation is obtained by inversion based on a plurality of sets of electromagnetic field measurement data of the antenna array, positions of a plurality of measurement points corresponding to the plurality of sets of measurement data, a plurality of array radiation patterns and a plurality of center positions corresponding to the plurality of array radiation patterns, and a radiation pattern of the antenna array at a target position is obtained based on the aperture field excitation, the plurality of array radiation patterns, the plurality of center positions and the target position.

Figure 1:
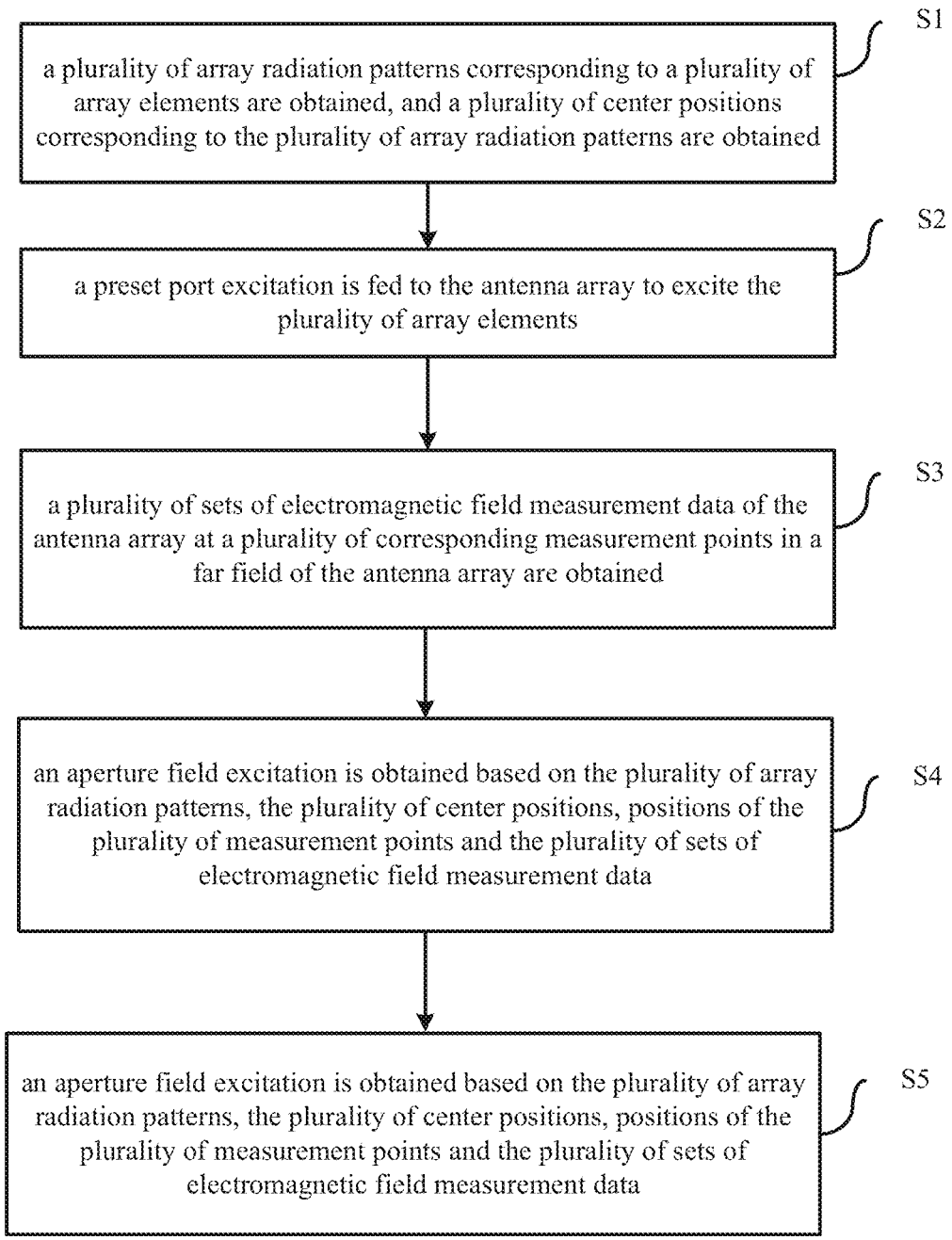
FIG. 1 is a flow chart of a method for measuring a radiation pattern of an antenna array according to an embodiment of the present disclosure.

FIG. 1 is a flow chart of a method for measuring a radiation pattern of an antenna array according to an embodiment of the present disclosure. As illustrated in FIG. 1, the method may include followings.

At block S1, a plurality of array radiation patterns corresponding to a plurality of array elements are obtained, and a plurality of center positions corresponding to the plurality of array radiation patterns are obtained.

In the present disclosure, the antenna array includes the plurality of array elements. The array radiation pattern refers to a true radiation pattern of the array element in the case of coupling with surrounding array elements in the antenna array. Each array element corresponds to an array radiation pattern, and the array radiation pattern can be obtained by measurement. For example, the antenna array is placed in an anechoic chamber, and each array element is separately fed, and the radiation pattern can be tested as the array radiation pattern corresponding to the array element.

In an embodiment of the present disclosure, the array radiation pattern may also be obtained based on at least one of a physical parameter, a mechanical model and a simulation model of the antenna array. The physical parameter includes an antenna form and an array structure.

At block S2, a preset port excitation is fed to the antenna array to excite the plurality of array elements.

In the embodiment, the preset port excitation may be defined as:

$$I = \begin{bmatrix} I_1 e^{jk\varphi_{I_1}} \\ I_2 e^{jk\varphi_{I_2}} \\ \vdots \\ I_N e^{jk\varphi_{I_N}} \end{bmatrix},$$

where I denotes the preset port excitation, $$I_n e^{jk\varphi_{I_n}}$$

denotes the port excitation fed to the $n^{th}$ array element, $I_n$ denotes an amplitude of the port excitation fed to the $n^{th}$ array element, j denotes an imaginary unit, $k=2\pi/\lambda$, $\lambda$ denotes the wavelength of the operating frequency of the antenna array, $k\varphi_{I_n}$ denotes the phase of the port excitation fed to the $n^{th}$ array element, n=1, 2, . . . , N, N denotes the number of the array elements in the antenna array.

At block S3, a plurality of sets of electromagnetic field measurement data of the antenna array at a plurality of corresponding measurement points in a far field of the antenna array are obtained.

In the present disclosure, each set of the measurement data includes amplitude and phase, the plurality of measurement points include M measurement points, the plurality of sets of electromagnetic field measurement data include M sets of electromagnetic field measurement data, $M \geq N/3$.

Irradiation measurement is performed on the antenna array by the testing antennas at the M measurement points, to obtain the M measurement points and the M sets of measurement data E at the M measurement points. The measurement data E includes amplitude and phase.

The testing antennas is in a same anechoic chamber as the antenna array, and the testing antenna can adopt a variety of measurement manners to obtain the measurement data, such as spherical scanning, plane scanning, cylindrical scanning, or other measurement manners, which is not limited in the present disclosure.

The plurality of measurement points are located in the far field of the array element, and the far field is greater than $2*D^2/\lambda$, where D denotes the size of the array element, $\lambda$ denotes the wavelength of the operating frequency of the antenna array.

At block S4, an aperture field excitation is obtained based on the plurality of array radiation patterns, the plurality of center positions, positions of the plurality of measurement points and the plurality of sets of electromagnetic field measurement data.

Specifically, the aperture field excitation is defined as:

$$I' = \begin{bmatrix} I'_1 e^{jk\varphi'_{I_1}} \\ I'_2 e^{jk\varphi'_{I_2}} \\ \vdots \\ I'_N e^{jk\varphi'_{I_N}} \end{bmatrix},$$

where I' denotes the aperture field excitation, $$I'_n e^{jk\varphi'_{I_n}}$$

denotes the aperture field excitation of the $n^{th}$ array element, $I'_n$ denotes an amplitude of the aperture filed excitation of the $n^{th}$ array element, and $k\varphi'_{I_n}$ denotes a phase of the aperture filed excitation of $n^{th}$ array element.

In an embodiment, a first amplitude phase transformation matrix from the plurality of array elements to the plurality of measurement points is obtained based on the plurality of array radiation patterns, the plurality of center positions and the positions of the plurality of measurement points, and the aperture field excitation is obtained based on a relationship among the first amplitude phase transformation matrix, the plurality of sets of electromagnetic field measurement data and the aperture field excitation.

The relationship among the first amplitude phase transformation matrix, the plurality of sets of electromagnetic field measurement data and the aperture field excitation satisfies an expression:

$$E = YI'$$

where E denotes the plurality of sets of electromagnetic field measurement data, Y denotes the first amplitude phase transformation matrix, and I' denotes the aperture field excitation.

At block S5, a radiation pattern of the antenna array at a target position is obtained based on the aperture field excitation, the plurality of array radiation patterns and the plurality of center positions.

In an embodiment, a second amplitude phase transformation matrix from the plurality of array elements to the target position is obtained based on the plurality of array radiation patterns, the plurality of center positions and the target position, and the radiation pattern of the antenna array at the target position is obtained based on a relationship among the second amplitude phase transformation matrix, the aperture field excitation and the radiation pattern at the target position.

The relationship among the second amplitude phase transformation matrix, the aperture field excitation and the radiation pattern at the target position satisfies an expression:

$$E'=(I')^T X$$

where E' denotes the radiation pattern at the target position, I' denotes the aperture field excitation, X denotes the second amplitude phase transformation matrix, and $( )^T$ denotes a transposition operation of a matrix.

It should be noted that, the implementation order of the above blocks may be changed. For example, it can also be implemented in an order of S2→S3→S1→S4→S5.

In the following, the calculation of the first amplitude phase transformation matrix Y from the plurality of array elements to the plurality of measurement points and the second amplitude phase transformation matrix X from the plurality of array elements to the target position will be described below.

A spherical coordinate system is established with any reference point as the origin, the coordinate of the center position of the array radiation pattern of the $n^{th}$ array element is denoted as $(R_n, \theta_n, \phi_n)$, the array radiation pattern of the $n^{th}$ array element is denoted as $f_n(\theta,\phi)$, the coordinate of the position of the $m^{th}$ measurement point is denoted as $(R'_m, \theta'_m, \phi'_m)$, m=1, 2, ..., M. The first amplitude phase transformation matrix Y from the N array elements to the M measurement points is denoted as:

$$Y = \begin{bmatrix} \frac{f_1(\theta'_{11}, \phi'_{11})e^{jk(|\vec{r'_{11}}|)}}{|\vec{r'_{11}}|} & \frac{f_2(\theta'_{12}, \phi'_{12})e^{jk(|\vec{r'_{12}}|)}}{|\vec{r'_{12}}|} & \cdots & \frac{f_N(\theta'_{1N}, \phi'_{1N})e^{jk(|\vec{r'_{1N}}|)}}{|\vec{r'_{1N}}|} \\ \frac{f_1(\theta'_{21}, \phi'_{21})e^{jk(|\vec{r'_{21}}|)}}{|\vec{r'_{21}}|} & \frac{f_2(\theta'_{22}, \phi'_{22})e^{jk(|\vec{r'_{22}}|)}}{|\vec{r'_{22}}|} & \cdots & \frac{f_N(\theta'_{2N}, \phi'_{2N})e^{jk(|\vec{r'_{2N}}|)}}{|\vec{r'_{2N}}|} \\ \vdots & \vdots & \ddots & \vdots \\ \frac{f_1(\theta'_{M1}, \phi'_{M1})e^{jk(|\vec{r'_{M1}}|)}}{|\vec{r'_{M1}}|} & \frac{f_2(\theta'_{M2}, \phi'_{M2})e^{jk(|\vec{r'_{M2}}|)}}{|\vec{r'_{M2}}|} & \cdots & \frac{f_N(\theta'_{MN}, \phi'_{MN})e^{jk(|\vec{r'_{MN}}|)}}{|\vec{r'_{MN}}|} \end{bmatrix},$$

where, $\frac{f_n(\theta'_{mn}, \phi'_{mn})e^{jk(|\vec{r'_{mn}}|)}}{|\vec{r'_{mn}}|}$ denotes an amplitude phase transformation factor of the $n^{th}$ array element at a position of the $m^{th}$ measurement point, n=1, 2, ..., N, m=1, 2, ..., M, $\theta'_{mn}$ denotes an azimuth angle of the position of the $m^{th}$ measurement point in a spherical coordinate system with a center position of an array radiation pattern of the $n^{th}$ array element as an origin, $\phi'_{mn}$ denotes an elevation angle of the position of the $m^{th}$ measurement point in the spherical coordinate system with the center position of the array radiation pattern of the $n^{th}$ array element as the origin, $f_n(\theta'_{mn}, \phi'_{mn})$ denotes the array radiation pattern of the $n^{th}$ array element at $(\theta'_{mn}, \phi'_{mn})$, $e^{jk(|\vec{r'_{mn}}|)}$ denotes a phase correction of the array radiation pattern of the $n^{th}$ array element at the position of the $m^{th}$ measurement point, $|\vec{r'_{mn}}|$ denotes a module of a vector from the position of the $m^{th}$ measurement point to the center position of the array radiation pattern of the $n^{th}$ array element, j denotes an imaginary unit, and k denotes a propagation constant of an electromagnetic wave.

Then, $$E = YI' = \begin{bmatrix} \frac{f_1(\theta'_{11}, \phi'_{11})e^{jk(|\vec{r'_{11}}|)}}{|\vec{r'_{11}}|} & \frac{f_2(\theta'_{12}, \phi'_{12})e^{jk(|\vec{r'_{12}}|)}}{|\vec{r'_{12}}|} & \cdots & \frac{f_N(\theta'_{1N}, \phi'_{1N})e^{jk(|\vec{r'_{1N}}|)}}{|\vec{r'_{1N}}|} \\ \frac{f_1(\theta'_{21}, \phi'_{21})e^{jk(|\vec{r'_{21}}|)}}{|\vec{r'_{21}}|} & \frac{f_2(\theta'_{22}, \phi'_{22})e^{jk(|\vec{r'_{22}}|)}}{|\vec{r'_{22}}|} & \cdots & \frac{f_N(\theta'_{2N}, \phi'_{2N})e^{jk(|\vec{r'_{2N}}|)}}{|\vec{r'_{2N}}|} \\ \vdots & \vdots & \ddots & \vdots \\ \frac{f_1(\theta'_{M1}, \phi'_{M1})e^{jk(|\vec{r'_{M1}}|)}}{|\vec{r'_{M1}}|} & \frac{f_2(\theta'_{M2}, \phi'_{M2})e^{jk(|\vec{r'_{M2}}|)}}{|\vec{r'_{M2}}|} & \cdots & \frac{f_N(\theta'_{MN}, \phi'_{MN})e^{jk(|\vec{r'_{MN}}|)}}{|\vec{r'_{MN}}|} \end{bmatrix} \begin{bmatrix} I'_1 e^{jk\varphi'_{I_1}} \\ I'_2 e^{jk\varphi'_{I_2}} \\ \vdots \\ I'_N e^{jk\varphi'_{I_N}} \end{bmatrix},$$

and the aperture field excitation I' can be calculated by:

$$I'=(Y^*Y)^{-1}Y^*E,$$

where ( )* denotes conjugate transpose.

The second amplitude phase transformation matrix X of the N array elements to the target position is denoted as:

$$X = \begin{bmatrix} \dfrac{f_1(\theta_1, \phi_1)e^{jk(|\vec{r_1}|)}}{|\vec{r_1}|} \\ \dfrac{f_2(\theta_2, \phi_2)e^{jk(|\vec{r_2}|)}}{|\vec{r_2}|} \\ \vdots \\ \dfrac{f_N(\theta_N, \phi_N)e^{jk(|\vec{r_N}|)}}{|\vec{r_N}|} \end{bmatrix},$$

where, $\dfrac{f_n(\theta_n, \phi_n)e^{jk(|\vec{r_n}|)}}{|\vec{r_n}|}$ denotes an amplitude phase transformation factor of the $n^{th}$ array element at the target position, $\theta_n$ denotes an azimuth angle of the target position in a spherical coordinate system with a center position of an array radiation pattern of the $n^{th}$ array element as an origin, $\phi_n$ denotes an elevation angle of the target position in the spherical coordinate system with the center position of the array radiation pattern of the $n^{th}$ array element as the origin, $f_n(\theta_n, \phi_n)$ denotes the array radiation pattern of the $n^{th}$ array element at $(\theta_n, \phi_n)$, $e^{jk(|\vec{r_n}|)}$ denotes a phase correction of the array radiation pattern of the $n^{th}$ array element at the target position, $|\vec{r_n}|$ denotes a module of a vector from the target position to the center position of the array radiation pattern of the $n^{th}$ array element, j denotes an imaginary unit, and k denotes a propagation constant of an electromagnetic wave.

Then, $$E' = (I')^T X = \begin{bmatrix} I'_1 e^{jk\varphi'_1} & I'_2 e^{jk\varphi'_2} & \ldots & I'_N e^{jk\varphi'_N} \end{bmatrix} \begin{bmatrix} \dfrac{f_1(\theta_1, \phi_1)e^{jk(|\vec{r_1}|)}}{|\vec{r_1}|} \\ \dfrac{f_2(\theta_2, \phi_2)e^{jk(|\vec{r_2}|)}}{|\vec{r_2}|} \\ \vdots \\ \dfrac{f_N(\theta_N, \phi_N)e^{jk(|\vec{r_N}|)}}{|\vec{r_N}|} \end{bmatrix},$$

Thus, the radiation pattern of the antenna array at the target position can be obtained.

In an embodiment, a coupling region of an array element may be defined as a circle with the array element as the center and $x\lambda$ as the radius, x is a real number not less than 1, and $\lambda$ is the wavelength of the operating frequency of the array antenna. When the number of array elements and position distribution in a first coupling region of a first array element is the same as the number of array elements and position distribution in a second coupling region of a second array element, the array radiation pattern of the first array element is the same as the array radiation pattern of the second array element.

In the embodiment, when the array radiation pattern of each array element in the antenna array is the same, i.e., $f_1(\theta,\phi)=f_2(\theta,\phi)=\ldots=f_N(\theta,\phi)=f_N(\theta,\phi)=f(\theta,\phi)$, the first amplitude phase transformation matrix Y from the plurality of array elements to the plurality of measurement points is noted as:

$$Y = \begin{bmatrix} \dfrac{f(\theta'_{11}, \phi'_{11})e^{jk(|\vec{r'_{11}}|)}}{|\vec{r'_{11}}|} & \dfrac{f(\theta'_{12}, \phi'_{12})e^{jk(|\vec{r'_{12}}|)}}{|\vec{r'_{12}}|} & \ldots & \dfrac{f(\theta'_{1N}, \phi'_{1N})e^{jk(|\vec{r'_{1N}}|)}}{|\vec{r'_{1N}}|} \\ \dfrac{f(\theta'_{21}, \phi'_{21})e^{jk(|\vec{r'_{21}}|)}}{|\vec{r'_{21}}|} & \dfrac{f(\theta'_{22}, \phi'_{22})e^{jk(|\vec{r'_{22}}|)}}{|\vec{r'_{22}}|} & \ldots & \dfrac{f(\theta'_{2N}, \phi'_{2N})e^{jk(|\vec{r'_{2N}}|)}}{|\vec{r'_{2N}}|} \\ \vdots & \vdots & \ddots & \vdots \\ \dfrac{f(\theta'_{M1}, \phi'_{M1})e^{jk(|\vec{r'_{M1}}|)}}{|\vec{r'_{M1}}|} & \dfrac{f(\theta'_{M2}, \phi'_{M2})e^{jk(|\vec{r'_{M2}}|)}}{|\vec{r'_{M2}}|} & \ldots & \dfrac{f(\theta'_{MN}, \phi'_{MN})e^{jk(|\vec{r'_{MN}}|)}}{|\vec{r'_{MN}}|} \end{bmatrix},$$

Then, $$E = YI' = \begin{bmatrix} \dfrac{f(\theta'_{11}, \phi'_{11})e^{jk(|\vec{r'_{11}}|)}}{|\vec{r'_{11}}|} & \dfrac{f(\theta'_{12}, \phi'_{12})e^{jk(|\vec{r'_{12}}|)}}{|\vec{r'_{12}}|} & \ldots & \dfrac{f(\theta'_{1N}, \phi'_{1N})e^{jk(|\vec{r'_{1N}}|)}}{|\vec{r'_{1N}}|} \\ \dfrac{f(\theta'_{21}, \phi'_{21})e^{jk(|\vec{r'_{21}}|)}}{|\vec{r'_{21}}|} & \dfrac{f(\theta'_{22}, \phi'_{22})e^{jk(|\vec{r'_{22}}|)}}{|\vec{r'_{22}}|} & \ldots & \dfrac{f(\theta'_{2N}, \phi'_{2N})e^{jk(|\vec{r'_{2N}}|)}}{|\vec{r'_{2N}}|} \\ \vdots & \vdots & \ddots & \vdots \\ \dfrac{f(\theta'_{M1}, \phi'_{M1})e^{jk(|\vec{r'_{M1}}|)}}{|\vec{r'_{M1}}|} & \dfrac{f(\theta'_{M2}, \phi'_{M2})e^{jk(|\vec{r'_{M2}}|)}}{|\vec{r'_{M2}}|} & \ldots & \dfrac{f(\theta'_{MN}, \phi'_{MN})e^{jk(|\vec{r'_{MN}}|)}}{|\vec{r'_{MN}}|} \end{bmatrix} \begin{bmatrix} I'_1 e^{jk\varphi'_1} \\ I'_2 e^{jk\varphi'_2} \\ \vdots \\ I'_N e^{jk\varphi'_N} \end{bmatrix},$$

and the aperture field excitation I' can be calculated by:

$$I'=(Y^*Y)^{-1}Y^*E$$

where $( )^*$ denotes conjugate transpose.

The second amplitude phase transformation matrix X of the N array elements to the target position is denoted as:

$$X = \begin{bmatrix} \dfrac{f_1(\theta_1, \phi_1)e^{jk(|\vec{r_1}|)}}{|\vec{r_1}|} \\ \dfrac{f_2(\theta_2, \phi_2)e^{jk(|\vec{r_2}|)}}{|\vec{r_2}|} \\ \vdots \\ \dfrac{f_N(\theta_N, \phi_N)e^{jk(|\vec{r_N}|)}}{|\vec{r_N}|} \end{bmatrix}.$$

Then, $$E' = (I')^T X = \begin{bmatrix} I'_1 e^{jk\varphi'_1} & I'_2 e^{jk\varphi'_2} & \cdots & I'_N e^{jk\varphi'_N} \end{bmatrix} \begin{bmatrix} \dfrac{f(\theta_1, \phi_1)e^{jk(|\vec{r_1}|)}}{|\vec{r_1}|} \\ \dfrac{f(\theta_2, \phi_2)e^{jk(|\vec{r_2}|)}}{|\vec{r_2}|} \\ \vdots \\ \dfrac{f(\theta_N, \phi_N)e^{jk(|\vec{r_N}|)}}{|\vec{r_N}|} \end{bmatrix},$$

Thus, the radiation pattern of the antenna array at the target position can be obtained.

In the present disclosure, since the array element having the same array radiation pattern can be treated equivalently, for the antenna array with a large number of array elements, the equivalent processing can greatly reduce measurement times or simulation calculation amount of the array elements, and the measurement speed can be greatly improved.

In an embodiment, when M=N/3, the number of equations is equal to the number of unknown variables to be solved, the aperture field excitation I' can be calculated by solving linear equations. When M>N/3, the number of equations is greater than the number of unknown variables to be solved, the aperture field excitation I' can be obtained by a least squares algorithm.

In embodiments of the present disclosure, for convenience of description, the spherical coordinate system is adopt, it should be understand that, other coordinate systems may also be adopted. For example, a rectangular coordinate system may be adopted, and the rectangular coordinate system may be converted based on a well-known conversion rule from the standard spherical coordinate system to the rectangular coordinate system, the present disclosure does not limit it.

Figure 2:
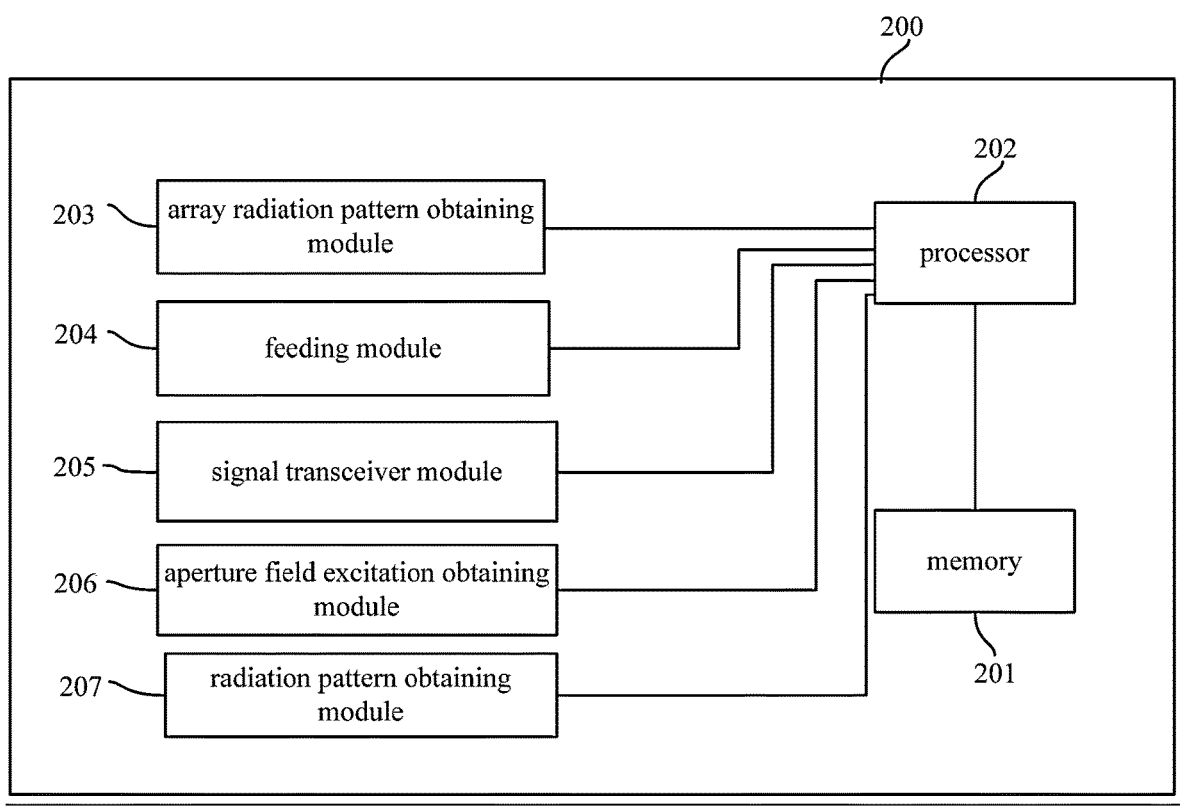
FIG. 2 is a schematic diagram of a device for measuring a radiation pattern of an antenna array according to an embodiment of the present disclosure.

FIG. 2 is a schematic diagram of an apparatus for measuring a radiation pattern of an antenna array. As illustrated in FIG. 2, the apparatus 200 includes a memory 201 and a processor 202. The memory 201 is coupled to the processor 202, so as to store operating systems, applications, computer program codes, data, or the like. The memory 201 is configured to store a computer program executable by the processor 202, when the computer program is executed by the processor 202, the above method according to embodiments of the present disclosure is implemented. The processor 201 is coupled to an array radiation pattern obtaining module 203, a feeding module 204, a signal transceiver module 205, an aperture field excitation obtaining module 206, and a radiation pattern obtaining module 207.

The array radiation pattern obtaining module 203 is configured to obtain a plurality of array radiation patterns corresponding to a plurality of array elements, and obtain a plurality of center positions corresponding to the plurality of array radiation patterns. The antenna array includes the plurality of array elements.

The feeding module 204 is configured to feed a preset port excitation to the antenna array, to excite the plurality of array elements.

The signal transceiver module 205 is coupled to the testing antenna, and is configured to obtain a plurality of sets of electromagnetic field measurement data of the antenna array obtained by the plurality of testing antennas. Each set of the electromagnetic field measurement data including amplitude and phase.

The aperture field excitation obtaining module 206 is configured to obtain an aperture field excitation based on the plurality of array radiation patterns, the plurality of center positions, positions of the plurality of measurement points and the plurality of sets of electromagnetic field measurement data.

The radiation pattern obtaining module 207 is configured to obtain a radiation pattern of the antenna array at a target position based on the aperture field excitation, the plurality of array radiation patterns and the plurality of center positions.

In at least one embodiment, the array radiation pattern obtaining module 203 is configured to obtain the plurality of array radiation patterns by measurement, or the array radiation pattern obtaining module 203 is configured to obtain the plurality of array radiation patterns by simulation based on at least one of a physical parameter, a mechanical model and a simulation model of the antenna array, and the physical parameter includes an antenna form and an array structure.

It should be noted that, for convenience of description, the apparatus 200 is illustrated, and the apparatus 200 may further include other modules. In addition, at least some modules of the apparatus 200 can be combined or subdivided.

Embodiments of the present disclosure further provide a device for measuring a radiation pattern of an antenna array. The device includes an anechoic chamber, a rotary table, a plurality of testing antennas and a controller. The rotary table is disposed in the anechoic chamber, and is configured to set an antenna array. The plurality of testing antennas are disposed in the anechoic chamber.

The controller is configured to: obtain a plurality of array radiation patterns corresponding to a plurality of array elements, the antenna array including the plurality of array elements; obtain a plurality of center positions corresponding to the plurality of array radiation patterns; feed a preset port excitation to the antenna array, to excite the plurality of array elements; obtain a plurality of sets of electromagnetic field measurement data of the antenna array obtained by the plurality of testing antennas, each set of the electromagnetic field measurement data including amplitude and phase; obtain an aperture field excitation based on the plurality of array radiation patterns, the plurality of center positions, positions of the plurality of measurement points and the plurality of sets of electromagnetic field measurement data; and obtain a radiation pattern of the antenna array at a target position based on the aperture field excitation, the plurality of array radiation patterns and the plurality of center positions.

Embodiments of the present disclosure further provide a non-transitory computer readable storage medium having computer programs stored therein. When the computer programs are executed by a processor, the processor is configured to perform the above method.

It should be noted that, embodiments of the present disclosure may be implemented in various ways, such as hardware, firmware, software, or a combination thereof.

The above embodiments illustrate merely some implementations of the present disclosure, which are described in details but are not construed to limit the scope of the present disclosure. It should be noted that, for those skilled in the art, various alternatives and modifications can be made to the described embodiments without departing from spirit and scope of the present disclosure, and the alternatives and modifications are considered to be within the scope of the present disclosure.

What is claimed is:

1. A method for measuring a radiation pattern of an antenna array, comprising:
   obtaining a plurality of array radiation patterns corresponding to a plurality of array elements by measurement or simulation, the antenna array comprising the plurality of array elements, wherein each of the plurality of array radiation patterns are obtained by measurement in response to each of the plurality of array elements being separately fed; or the plurality of array radiation patterns are obtained by simulation based on at least one of a physical parameter, a mechanical model and a simulation model of the antenna array, and the physical parameter comprises an antenna form and an array structure;
   obtaining a plurality of center positions corresponding to the plurality of array radiation patterns;
   feeding a preset port excitation to the antenna array, to excite all of the plurality of array elements simultaneously;
   measuring at a plurality of measurement points in a far field of the antenna array to obtain a plurality of sets of combined electromagnetic field measurement data of an entirety of the antenna array, each set of the combined electromagnetic field measurement data comprising amplitude and phase;
   determining an aperture field excitation based on the plurality of array radiation patterns, the plurality of center positions, positions of the plurality of measurement points and the plurality of sets of combined electromagnetic field measurement data; and
   determining a radiation pattern of the antenna array at a target position based on the aperture field excitation, the plurality of array radiation patterns and the plurality of center positions;
   wherein the antenna array comprises N array elements, and the plurality of measurement points comprise M measurement points, irradiation measurement is performed on the antenna array at the M measurement points, to obtain the M measurement points and the M sets of measurement data E at the M measurement points;
   wherein a relationship among a first amplitude phase transformation matrix, the plurality of sets of combined electromagnetic field measurement data and the aperture field excitation satisfies an expression:

$E=YI'$ where E denotes the plurality of sets of combined electromagnetic field measurement data and is a M×1 matrix, Y denotes the first amplitude phase transformation matrix from the plurality of array elements to the plurality of measurement points and is a M×1 matrix, and the first amplitude phase transformation matrix is obtained based on the plurality of array radiation patterns, the plurality of center positions and the positions of the plurality of measurement points, and I' denotes the aperture field excitation and is a N×1 matrix;
   wherein the first amplitude phase transformation matrix is obtained based on an azimuth angle of a position of each measurement point in a coordinate system with a center position of an array radiation pattern of each array element as an origin, an elevation angle of a position of each measurement point in the coordinate system with the center position of the array radiation pattern of each array element as the origin, the array radiation pattern of each array element at each set of azimuth angle and elevation angle, a phase correction of the array radiation pattern of each array element at the position of each measurement point, and a module of a vector from the position of each measurement point to the center position of the array radiation pattern of each array element.

2. The method according to claim 1, wherein obtaining the plurality of sets of combined electromagnetic field measurement data of the antenna array comprises:
   obtaining the plurality of sets of combined electromagnetic field measurement data based on a plurality of testing antennas correspondingly located at the plurality of measurement points.

3. The method according to claim 2, wherein the plurality of testing antennas are in a same anechoic chamber as the antenna array.

4. The method according to claim 1, wherein when the number of array elements and position distribution in a first coupling region of a first array element is the same as the number of array elements and position distribution in a second coupling region of a second array element, the array radiation pattern of the first array element is the same as the array radiation pattern of the second array element.

5. The method according to claim 1, wherein obtaining the radiation pattern of the antenna array at the target position based on the aperture field excitation, the plurality of array radiation patterns and the plurality of center positions comprises:
   obtaining a second amplitude phase transformation matrix from the plurality of array elements to the target position based on the plurality of array radiation patterns, the plurality of center positions and the target position; and
   obtaining the radiation pattern of the antenna array at the target position based on a relationship among the second amplitude phase transformation matrix, the aperture field excitation and the radiation pattern at the target position, wherein the relationship among the second amplitude phase transformation matrix, the aperture field excitation and the radiation pattern at the target position satisfies an expression:

$E'=(I')^T X$ where E' denotes the radiation pattern at the target position, I' denotes the aperture field excitation, X denotes the second amplitude phase transformation matrix, and $(\ )^T$ denotes a transposition operation of a matrix.

6. The method according claim 5, wherein the antenna array comprises N array elements, and the second amplitude phase transformation matrix X of the N array elements to the target position is denoted as:

$$X = \begin{bmatrix} \dfrac{f_1(\theta_1, \phi_1)e^{jk(|\vec{r_1}|)}}{|\vec{r_1}|} \\ \dfrac{f_2(\theta_2, \phi_2)e^{jk(|\vec{r_2}|)}}{|\vec{r_2}|} \\ \vdots \\ \dfrac{f_N(\theta_N, \phi_N)e^{jk(|\vec{r_N}|)}}{|\vec{r_N}|} \end{bmatrix},$$

where, $\dfrac{f_n(\theta_n, \phi_n)e^{jk(|\vec{r_n}|)}}{|\vec{r_n}|}$ denotes an amplitude phase transformation factor of the $n^{th}$ array element at the target position, $\theta_n$ denotes an azimuth angle of the target position in a spherical coordinate system with a center position of an array radiation pattern of the $n^{th}$ array element as an origin, $\phi_n$ denotes an elevation angle of the target position in the spherical coordinate system with the center position of the array radiation pattern of the $n^{th}$ array element as the origin, $f_n(\theta_n, \phi_n)$ denotes the array radiation pattern of the $n^{th}$ array element at $(\theta_n, \phi_n)$, $e^{jk(|\vec{r}'_{mn}|)}$ denotes a phase correction of the array radiation pattern of the $n^{th}$ array element at the target position, $|\vec{r}_n|$ denotes a module of a vector from the target position to the center position of the array radiation pattern of the $n^{th}$ array element, j denotes an imaginary unit, and k denotes a propagation constant of an electromagnetic wave.

7. The method according to claim 5, wherein the antenna array comprises N array elements, and the plurality of sets of combined electromagnetic field measurement data comprise M sets of combined electromagnetic field measurement data, M≥N/3.

8. The method according to claim 7, wherein when M≥N/3, the aperture field excitation is obtained by a least squares algorithm.

9. The method according to claim 5, wherein obtaining the aperture field excitation based on the plurality of array radiation patterns, the plurality of center positions, the positions of the plurality of measurement points and the plurality of sets of combined electromagnetic field measurement data comprises:

obtaining a first amplitude phase transformation matrix from the plurality of array elements to the plurality of measurement points based on the plurality of array radiation patterns, the plurality of center positions and the positions of the plurality of measurement points; and obtaining the aperture field excitation based on a relationship among the first amplitude phase transformation matrix, the plurality of sets of combined electromagnetic field measurement data and the aperture field excitation, wherein the relationship among the first amplitude phase transformation matrix, the plurality of sets of combined electromagnetic field measurement data and the aperture field excitation satisfies an expression:

$$E = YI'$$

where E denotes the plurality of sets of combined electromagnetic field measurement data, Y denotes the first amplitude phase transformation matrix, and I' denotes the aperture field excitation.

10. The method according to claim 9, wherein the antenna array comprises N array elements, and the plurality of measurement points comprise M measurement points;

the first amplitude phase transformation matrix Y from the N array elements to the M measurement points is denoted as:

$$Y = \begin{bmatrix} \dfrac{f_1(\theta'_{11}, \phi'_{11})e^{jk(|\vec{r'_{11}}|)}}{|\vec{r'_{11}}|} & \dfrac{f_2(\theta'_{12}, \phi'_{12})e^{jk(|\vec{r'_{12}}|)}}{|\vec{r'_{12}}|} & \cdots & \dfrac{f_N(\theta'_{1N}, \phi'_{1N})e^{jk(|\vec{r'_{1N}}|)}}{|\vec{r'_{1N}}|} \\ \dfrac{f_1(\theta'_{21}, \phi'_{21})e^{jk(|\vec{r'_{21}}|)}}{|\vec{r'_{21}}|} & \dfrac{f_2(\theta'_{22}, \phi'_{22})e^{jk(|\vec{r'_{22}}|)}}{|\vec{r'_{22}}|} & \cdots & \dfrac{f_N(\theta'_{2N}, \phi'_{2N})e^{jk(|\vec{r'_{2N}}|)}}{|\vec{r'_{2N}}|} \\ \vdots & \vdots & \ddots & \vdots \\ \dfrac{f_1(\theta'_{M1}, \phi'_{M1})e^{jk(|\vec{r'_{M1}}|)}}{|\vec{r'_{M1}}|} & \dfrac{f_2(\theta'_{M2}, \phi'_{M2})e^{jk(|\vec{r'_{M2}}|)}}{|\vec{r'_{M2}}|} & \cdots & \dfrac{f_N(\theta'_{MN}, \phi'_{MN})e^{jk(|\vec{r'_{MN}}|)}}{|\vec{r'_{MN}}|} \end{bmatrix},$$

where, $\dfrac{f_n(\theta'_{mn}, \phi'_{mn})e^{jk(|\vec{r'_{mn}}|)}}{|\vec{r'_{mn}}|}$ denotes an amplitude phase transformation factor of the $n^{th}$ array element at a position of the $m^{th}$ measurement point, n=1, 2, ..., N m=1, 2, ..., M, $\theta'_{mn}$ denotes an azimuth angle of the position of the $m^{th}$ measurement point in a spherical coordinate system with a center position of an array radiation pattern of the $n^{th}$ array element as an origin, $\phi_{mn}$ denotes an elevation angle of the position of the $m^{th}$ measurement point in the spherical coordinate system with the center position of the array radiation pattern of the $n^{th}$ array element as the origin, $f_n(\theta'_{mn}, \phi'_{mn})$ denotes the array radiation pattern of the $n^{th}$ array element at $(\theta'_{mn}, \phi'_{mn})$, $e^{jk(|\vec{r}'_{mn}|)}$ denotes a phase correction of the array radiation pattern of the $n^{th}$ array element at the position of the $m^{th}$ measurement point, $|\vec{r}'_{mn}|$ denotes a module of a vector from the position of the $m^{th}$ measurement point to the center position of the array radiation pattern of the $n^{th}$ array element, j denotes an imaginary unit, and k denotes a propagation constant of an electromagnetic wave.

11. A device for measuring a radiation pattern of an antenna array, comprising:

an anechoic chamber;
a rotary table, disposed in the anechoic chamber, and configured to set an antenna array;
a plurality of testing antennas, disposed in the anechoic chamber, and
a controller,
wherein the controller is configured to:
  obtain a plurality of array radiation patterns corresponding to a plurality of array elements by measurement or simulation, the antenna array comprising the plurality of array elements, wherein each of the plurality of array radiation patterns are obtained by measurement in response to each of the plurality of array elements being separately fed; or the plurality of array radiation patterns are obtained by simulation based on at least one of a physical parameter, a mechanical model and a simulation model of the antenna array, and the physical parameter comprises an antenna form and an array structure;
  obtain a plurality of center positions corresponding to the plurality of array radiation patterns;
  feed a preset port excitation to the antenna array, to excite all of the plurality of array elements simultaneously;
  measure at a plurality of measurement points in a far field of the antenna array to obtain a plurality of sets of combined electromagnetic field measurement data of an entirety of the antenna array, each set of the combined electromagnetic field measurement data comprising amplitude and phase;
  determine an aperture field excitation based on the plurality of array radiation patterns, the plurality of center positions, positions of the plurality of measurement points and the plurality of sets of combined electromagnetic field measurement data; and
  determine a radiation pattern of the antenna array at a target position based on the aperture field excitation, the plurality of array radiation patterns and the plurality of center positions;
wherein the antenna array comprises N array elements, and the plurality of measurement points comprise M measurement points, irradiation measurement is performed on the antenna array at the M measurement points, to obtain the M measurement points and the M sets of measurement data E at the M measurement points;
wherein a relationship among a first amplitude phase transformation matrix, the plurality of sets of combined electromagnetic field measurement data and the aperture field excitation satisfies an expression:

$$E = YI'$$

where E denotes the plurality of sets of combined electromagnetic field measurement data and is a M×1 matrix, Y denotes the first amplitude phase transformation matrix from the plurality of array elements to the plurality of measurement points and is a M×1 matrix, and the first amplitude phase transformation matrix is obtained based on the plurality of array radiation patterns, the plurality of center positions and the positions of the plurality of measurement points, and I' denotes the aperture field excitation and is a N×1 matrix;
wherein the first amplitude phase transformation matrix is obtained based on an azimuth angle of a position of each measurement point in a spherical coordinate system with a center position of an array radiation pattern of each array element as an origin, an elevation angle of a position of each measurement point in the spherical coordinate system with the center position of the array radiation pattern of each array element as the origin, the array radiation pattern of each array element at each set of azimuth angle and elevation angle, a phase correction of the array radiation pattern of each array element at the position of each measurement point, and a module of a vector from the position of each measurement point to the center position of the array radiation pattern of each array element.

12. The device according to claim 11, wherein when the number of array elements and position distribution in a first coupling region of a first array element is the same as the number of array elements and position distribution in a second coupling region of a second array element, the array radiation pattern of the first array element is the same as the array radiation pattern of the second array element.

13. The device according to claim 11, wherein when the controller is configured to obtain the radiation pattern of the antenna array at the target position based on the aperture field excitation, the plurality of array radiation patterns and the plurality of center positions, the controller is configured to:
  obtain a second amplitude phase transformation matrix from the plurality of array elements to the target position based on the plurality of array radiation patterns, the plurality of center positions and the target position; and
  obtain the radiation pattern of the antenna array at the target position based on a relationship among the second amplitude phase transformation matrix, the aperture field excitation and the radiation pattern at the target position, wherein the relationship among the second amplitude phase transformation matrix, the aperture field excitation and the radiation pattern at the target position satisfies an expression:

$$E' = (I')^T X$$

where E' denotes the radiation pattern at the target position, I' denotes the aperture field excitation, X denotes the second amplitude phase transformation matrix, and $(\ )^T$ denotes a transposition operation of a matrix.

14. The device according claim 13, the antenna array comprises N array elements, and the second amplitude phase transformation matrix X of the N array elements to the target position is denoted as:

$$X = \begin{bmatrix} \dfrac{f_1(\theta_1, \phi_1)e^{jk(|\vec{r_1}|)}}{|\vec{r_1}|} \\ \dfrac{f_2(\theta_2, \phi_2)e^{jk(|\vec{r_2}|)}}{|\vec{r_2}|} \\ \vdots \\ \dfrac{f_N(\theta_N, \phi_N)e^{jk(|\vec{r_N}|)}}{|\vec{r_N}|} \end{bmatrix},$$

where, $\dfrac{f_n(\theta_n, \phi_n)e^{jk(|\vec{r_n}|)}}{|\vec{r_n}|}$ denotes an amplitude phase transformation factor of the $n^{th}$ array element at the target position, $\theta_n$ denotes an azimuth angle of the target position in a spherical coordinate system with a center position of an array radiation pattern of the $n^{th}$ array element as an origin, $\phi_n$ denotes an elevation angle of the target position in the spherical coordinate system with the center position of the array radiation pattern of the $n^{th}$ array element as the origin, $f_n(\theta_{mn}, \phi_{mn})$ denotes the array radiation pattern of the $n^{th}$ array element at $(\theta_{mn}, \phi_{mn})$, $e^{jk(|\vec{r}'_{mn}|)}$ denotes a phase correction of the array radiation pattern of the $n^{th}$ array element at the target position, $|\vec{r}'_{mn}|$ denotes a module of a vector from the target position to the center position of the array radiation pattern of the $n^{th}$ array element, j denotes an imaginary unit, and k denotes a propagation constant of an electromagnetic wave.

15. The device according to claim 11, wherein the antenna array comprises N array elements, and the plurality of sets of combined electromagnetic field measurement data comprise M sets of combined electromagnetic field measurement data, $M \geq N/3$;
when $M \geq N/3$, the aperture field excitation is obtained by a least squares algorithm.

16. The device according to claim 11, wherein when the controller is configured to obtain the aperture field excitation based on the plurality of array radiation patterns, the plurality of center positions, the positions of the plurality of measurement points and the plurality of sets of combined electromagnetic field measurement data, the controller is configured to:
obtain a first amplitude phase transformation matrix from the plurality of array elements to the plurality of measurement points based on the plurality of array radiation patterns, the plurality of center positions and the positions of the plurality of measurement points; and
obtain the aperture field excitation based on a relationship among the first amplitude phase transformation matrix, the plurality of sets of combined electromagnetic field measurement data and the aperture field excitation, wherein the relationship among the first amplitude phase transformation matrix, the plurality of sets of combined electromagnetic field measurement data and the aperture field excitation satisfies an expression:

$$E = YI'$$

where E denotes the plurality of sets of combined electromagnetic field measurement data, Y denotes the first amplitude phase transformation matrix, and I' denotes the aperture field excitation.

17. The device according to claim 16, wherein the antenna array comprises N array elements, and the plurality of measurement points comprise M measurement points;
the first amplitude phase transformation matrix Y from the N array elements to the M measurement points is denoted as:

$$Y = \begin{bmatrix} \frac{f_1(\theta'_{11}, \phi'_{11})e^{jk(|\vec{r}'_{11}|)}}{|\vec{r}'_{11}|} & \frac{f_2(\theta'_{12}, \phi'_{12})e^{jk(|\vec{r}'_{12}|)}}{|\vec{r}'_{12}|} & \cdots & \frac{f_N(\theta'_{1N}, \phi'_{1N})e^{jk(|\vec{r}'_{1N}|)}}{|\vec{r}'_{1N}|} \\ \frac{f_1(\theta'_{21}, \phi'_{21})e^{jk(|\vec{r}'_{21}|)}}{|\vec{r}'_{21}|} & \frac{f_2(\theta'_{22}, \phi'_{22})e^{jk(|\vec{r}'_{22}|)}}{|\vec{r}'_{22}|} & \cdots & \frac{f_N(\theta'_{2N}, \phi'_{2N})e^{jk(|\vec{r}'_{2N}|)}}{|\vec{r}'_{2N}|} \\ \vdots & \vdots & \ddots & \vdots \\ \frac{f_1(\theta'_{M1}, \phi'_{M1})e^{jk(|\vec{r}'_{M1}|)}}{|\vec{r}'_{M1}|} & \frac{f_2(\theta'_{M2}, \phi'_{M2})e^{jk(|\vec{r}'_{M2}|)}}{|\vec{r}'_{M2}|} & \cdots & \frac{f_N(\theta'_{MN}, \phi'_{MN})e^{jk(|\vec{r}'_{MN}|)}}{|\vec{r}'_{MN}|} \end{bmatrix},$$

where, $\frac{f_n(\theta'_{mn}, \phi'_{mn})e^{jk(|\vec{r}'_{mn}|)}}{|\vec{r}'_{mn}|}$ denotes an amplitude phase transformation factor of the $n^{th}$ array element at a position of the $m^{th}$ measurement point, n=1, 2, ..., N, m=1, 2, M, $\theta'_{mn}$ denotes an azimuth angle of the position of the $m^{th}$ measurement point in a spherical coordinate system with a center position of an array radiation pattern of the $n^{th}$ array element as an origin, $\phi'^{mn}$ denotes an elevation angle of the position of the $m^{th}$ measurement point in the spherical coordinate system with the center position of the array radiation pattern of the $n^{th}$ array element as the origin, $f_n(\theta'_{mn}, \phi'_{mn})$ denotes the array radiation pattern of the $n^{th}$ array element at $(\theta'_{mn}, \phi'_{mn})$, $e^{jk(|\vec{r}'_{mn}|)}$ denotes a phase correction of the array radiation pattern of the $n^{th}$ array element at the position of the $m^{th}$ measurement point, $|\vec{r}'_{mn}|$ denotes a module of a vector from the position of the $m^{th}$ measurement point to the center position of the array radiation pattern of the $n^{th}$ array element, j denotes an imaginary unit, and k denotes a propagation constant of an electromagnetic wave.

18. A non-transitory computer readable storage medium, having computer programs stored therein, wherein when the computer programs are executed by a processor, the processor is configured to:
obtain a plurality of array radiation patterns corresponding to a plurality of array elements by measurement or simulation, an antenna array comprising the plurality of array elements, wherein each of the plurality of array radiation patterns are obtained by measurement in response to each of the plurality of array elements being separately fed; or the plurality of array radiation patterns are obtained by simulation based on at least one of a physical parameter, a mechanical model and a simulation model of the antenna array, and the physical parameter comprises an antenna form and an array structure;
obtain a plurality of center positions corresponding to the plurality of array radiation patterns;
feed a preset port excitation to the antenna array, to excite all of the plurality of array elements simultaneously;
measure at a plurality of measurement points in a far field of the antenna array to obtain a plurality of sets of combined electromagnetic field measurement data of an entirety of the antenna array, each set of the combined electromagnetic field measurement data comprising amplitude and phase;

determine an aperture field excitation based on the plurality of array radiation patterns, the plurality of center positions, positions of the plurality of measurement points and the plurality of sets of combined electromagnetic field measurement data; and determine a radiation pattern of the antenna array at a target position based on the aperture field excitation, the plurality of array radiation patterns and the plurality of center positions;

wherein the antenna array comprises N array elements, and the plurality of measurement points comprise M measurement points, irradiation measurement is performed on the antenna array at the M measurement points, to obtain the M measurement points and the M sets of measurement data E at the M measurement points;

wherein a relationship among a first amplitude phase transformation matrix, the plurality of sets of combined electromagnetic field measurement data and the aperture field excitation satisfies an expression:

$E = YI'$ where E denotes the plurality of sets of combined electromagnetic field measurement data and is a M×1 matrix, Y denotes the first amplitude phase transformation matrix from the plurality of array elements to the plurality of measurement points and is a M×1 matrix, and the first amplitude phase transformation matrix is obtained based on the plurality of array radiation patterns, the plurality of center positions and the positions of the plurality of measurement points, and I' denotes the aperture field excitation and is a N×1 matrix;

wherein the first amplitude phase transformation matrix is obtained based on an azimuth angle of a position of each measurement point in a spherical coordinate system with a center position of an array radiation pattern of each array element as an origin, an elevation angle of a position of each measurement point in the spherical coordinate system with the center position of the array radiation pattern of each array element as the origin, the array radiation pattern of each array element at each set of azimuth angle and elevation angle, a phase correction of the array radiation pattern of each array element at the position of each measurement point, and a module of a vector from the position of each measurement point to the center position of the array radiation pattern of each array element.

* * * * *